US010280531B2

(12) United States Patent
Ueda et al.

(10) Patent No.: US 10,280,531 B2
(45) Date of Patent: May 7, 2019

(54) DIAMOND SINGLE CRYSTAL AND PRODUCTION METHOD THEREOF, AND SINGLE CRYSTAL DIAMOND TOOL

(71) Applicant: SUMITOMO ELECTRIC INDUSTRIES, LTD., Osaka-shi, Osaka (JP)

(72) Inventors: Akihiko Ueda, Itami (JP); Yoshiki Nishibayashi, Itami (JP); Hitoshi Sumiya, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 103 days.

(21) Appl. No.: 15/228,423

(22) Filed: Aug. 4, 2016

(65) Prior Publication Data

US 2016/0340801 A1 Nov. 24, 2016

Related U.S. Application Data

(63) Continuation of application No. 14/408,830, filed as application No. PCT/JP2013/067632 on Jun. 27, 2013, now Pat. No. 9,441,312.

(30) Foreign Application Priority Data

Jun. 29, 2012 (JP) ................................. 2012-146444
Jul. 6, 2012 (JP) ................................. 2012-152485
Jul. 6, 2012 (JP) ................................. 2012-152503

(51) Int. Cl.
*C30B 29/04* (2006.01)
*C30B 25/18* (2006.01)
(Continued)

(52) U.S. Cl.
CPC .......... *C30B 25/186* (2013.01); *B23B 27/148* (2013.01); *C30B 25/20* (2013.01);
(Continued)

(58) Field of Classification Search
USPC ............................ 51/307, 309; 428/212, 408
See application file for complete search history.

(56) References Cited

U.S. PATENT DOCUMENTS 5,139,372 A     8/1992   Tanabe et al.
5,523,121 A *   6/1996   Anthony ................. C23C 16/01
                                                    428/408
(Continued)

FOREIGN PATENT DOCUMENTS

CN      101248210 A     8/2008
CN      102471923 A     5/2012
(Continued)

OTHER PUBLICATIONS

Ralchenko et al "Structure and properties of high-temperature annealed CVD diamond" Diamond & Related Materials 12 (2003) p. 1964-1970. (Year: 2003).*

(Continued)

*Primary Examiner* — Archene A Turner
(74) *Attorney, Agent, or Firm* — Global IP Counselors, LLP

(57) ABSTRACT

A method for producing a diamond single crystal includes implanting an ion other than carbon into a surface of a diamond single crystal seed substrate and thereby decreasing the transmittance of light having a wavelength of 800 nm, the surface having an off-angle of 7 degrees or less with respect to a {100} plane, and homoepitaxially growing a diamond single crystal on the ion-implanted surface of the seed substrate using a chemical vapor synthesis under synthesis conditions where the ratio $N_C/N_H$ of the number of carbon-containing molecules $N_C$ to the number of hydrogen molecules $N_H$ in a gas phase is 10% or more and 40% or less, the ratio $N_N/N_C$ of the number of nitrogen molecules $N_N$ to the number of carbon-containing molecules $N_C$ in the gas (Continued)

phase is 0.1% or more and 10% or less, and the seed substrate temperature T is 850° C. or more and less than 1000° C.

2 Claims, 1 Drawing Sheet

(51) Int. Cl.
    *C30B 25/20*     (2006.01)
    *B23B 27/14*     (2006.01)
    *C30B 30/00*     (2006.01)
    *C30B 31/22*     (2006.01)

(52) U.S. Cl.
    CPC .............. *C30B 29/04* (2013.01); *C30B 30/00* (2013.01); *C30B 31/22* (2013.01); *B23B 2226/31* (2013.01); *Y10T 407/24* (2015.01); *Y10T 428/30* (2015.01)

(56) References Cited

U.S. PATENT DOCUMENTS

| | | | |
|---|---|---|---|
| 7,172,655 | B2 | 2/2007 | Twitchen et al. |
| 2009/0308305 | A1* | 12/2009 | Mokuno ............... C30B 25/00 117/108 |
| 2010/0123098 | A1 | 5/2010 | Hemley et al. |
| 2010/0126406 | A1 | 5/2010 | Yan et al. |
| 2010/0166636 | A1 | 7/2010 | Yamada et al. |
| 2011/0017126 | A1 | 1/2011 | Twitchen et al. |
| 2015/0176155 | A1* | 6/2015 | Ueda ..................... C30B 29/04 428/408 |

FOREIGN PATENT DOCUMENTS

| | | |
|---|---|---|
| EP | 2048267 A1 | 4/2009 |
| JP | H07-172988 A | 7/1995 |
| JP | H05-197309 A | 8/1996 |
| JP | H08-197309 A | 8/1996 |
| JP | 2004-022821 A | 3/2004 |
| JP | 2005-538018 A | 12/2005 |
| JP | 2007-112637 A | 5/2007 |
| JP | 2007-191356 A | 8/2007 |
| JP | 2008-207334 A | 9/2008 |
| JP | 4344244 B2 | 10/2009 |
| JP | 2011-519814 A | 7/2011 |
| JP | 2012-051793 A | 3/2012 |
| JP | 2012-509831 A | 4/2012 |
| JP | 2013-035732 A | 2/2013 |
| WO | 0179583 A2 | 10/2001 |
| WO | 03-052177 A1 | 6/2003 |
| WO | 2004022821 A1 | 3/2004 |
| WO | 2009-137020 A1 | 11/2009 |
| WO | 2010-068419 A2 | 6/2010 |
| WO | 2010-149775 A1 | 12/2010 |
| WO | 2010-149777 A1 | 12/2010 |

OTHER PUBLICATIONS

Nistor et al "Formation of Amorphous Carbon and Graphite in CVD Diamond upon Annealing: A HREM, EELS, Raman and Optical Study" Phys. Stat Sol (a0 186 No. 2 (2001) p. 207-214 (Year: 2001).*

Search Report in the corresponding European Patent Application No. 13809060.0 dated Apr. 20, 2016.

Partial Supplementary Search Report in the corresponding European Patent Application No. 13809060.0 dated Feb. 1, 2016.

Office Action in the corresponding Chinese Patent Application No. 201380034864.9 dated Apr. 28, 2016.

Rizwan, U.A. Khan et al., Color alterations in CVD synthetic diamond with heat and UV exposure: implications for color grading and identification, Gem & Gemology, spring 2010 pp. 18-26.

K. Meykens, et al, "Optical absorption and cathodoluminescence in homoepitaxially grown CVD diamond films", Diamond and Related Materials 5, 1996, pp. 958-963.

Diamond Materials, "The CVD diamond booklet", downloaded Dec. 2018, pp. 1 to 28.

Element Six, "Taking Unpredictability Out of Mechanical Applications", Dec. 2016, pp. 1 to 16.

A. Lammer, "Mechanical Properties of Polycrystalline Diamonds", Materials Science and Technology, Nov. 1988, vol. 4, pp. 1 to 8.

DDK, "SC-CVD Diamond Properties", downloaded Dec. 2018.

* cited by examiner

DIAMOND SINGLE CRYSTAL AND PRODUCTION METHOD THEREOF, AND SINGLE CRYSTAL DIAMOND TOOL

CROSS-REFERENCE TO RELATED APPLICATIONS

This is a continuation application of U.S. application Ser. No. 14/408,830, filed Dec. 17, 2014, which is a U.S. National stage application claiming priority under 35 U.S.C. § 119(a) to Japanese Patent Application No. 2012-146444 filed in Japan on Jun. 29, 2012, Japanese Patent Application No. 2012-152485 filed in Japan on Jul. 6, 2012, and Japanese Patent Application No. 2012-152503, filed in Japan on Jul. 6, 2012. The entire contents of U.S. application Ser. No. 14/408,830, Japanese Patent Application No. 2012-146444, Japanese Patent Application No. 2012-152485 and Japanese Patent Application No. 2012-152503 are hereby incorporated herein by reference in their entirety.

TECHNICAL FIELD

The present invention relates to a diamond single crystal for use in cutting tools, abrasion-resistant tools, precision tools, heat-dissipating members, substrates for semiconductor devices, and optical components, a method for producing the diamond single crystal, and a single crystal diamond tool, particularly a single crystal diamond cutting tool, for use in turning of parts of automobiles, mirror finish of optical components, spherical processing, and fine fluting.

BACKGROUND ART

Because of their excellent characteristics, such as high hardness, high thermal conductivity, high light transmittance, and wide band gap, diamonds are widely used as materials of various tools, optical components, semiconductors, and electronic components and will become more important in the future.

In addition to natural diamonds, synthetic diamonds having stable quality are mainly used in industrial applications. Presently, most synthetic diamond single crystals are industrially synthesized under conditions where diamonds exist in a stable state, that is, at a temperature in the range of approximately one-thousand one-hundred to two-thousand nine-hundred degrees centigrade and at a pressure of at least tens of thousands of atmospheres. In addition to the high-temperature high-pressure synthesis method, another established diamond synthesis method is a gas-phase synthesis method. With recent advances in production techniques for diamond single crystals produced using a gas-phase synthesis method, that is, chemical vapor deposition (CVD) diamond single crystals, diamonds for use in tool and optical applications, as well as jewelry have been commercially produced, as described in Non Patent Literature 1 and Patent Literature 1.

For example, single crystal diamond tools are used in mirror finish and precision processing of nonferrous metals, such as aluminum alloys and copper alloys, and plastics, such as acrylics, for use in automobiles, optical apparatuses, and electronic equipment. Since single crystal diamond tools are generally more expensive than sintered diamond tools, which are often used in relatively rough processing, inexpensive and improved single crystal diamond tools have been proposed in Patent Literature 2, for example.

In industrial applications of diamond single crystals, relatively large millimeter- or centimeter-size single crystals are mostly used in cutting tools, such as bits, dressers, and end mills. These diamond single crystals are used in industrial basic processes, such as dressing of whetstones, ultra-precision machining of nonferrous metals, and mirror finish of resins. Thus, it is important to constantly and stably supply diamond single crystals.

Single crystal diamond tools, such as cutting tools (bits), dressers, and end mills, are used in industrial basic processes, as described above. Thus, it is important to stably supply diamond single crystals for use in these single crystal diamond tools.

Fluctuation in the price and amount of commercial natural diamond single crystals, which account for most of the industrial diamonds, is a factor contrary to stable supply. Because of the limited reserve of natural diamonds, the reserve of natural diamonds is decreasing with mining. A decrease in the reserve of natural diamonds may cause an increase in price or a decrease in the amount of commercial natural diamond single crystals. Thus, the role of synthetic diamond single crystals is expected to become more important.

Furthermore, natural diamond single crystals will be gradually substituted by CVD diamond single crystals. However, in industrial applications, particularly in cutting tool applications, existing CVD diamond single crystals are not as widespread as high-pressure synthesized diamond single crystals. This is because CVD diamond single crystals have lower toughness than natural diamond single crystals and high-temperature and high-pressure synthesized Ib-type diamond single crystals, and there is the technical problem that CVD diamond single crystals are difficult to process into the shape of a tool, such as a bit or an end mill, or chips or cracks tend to form during processing of a workpiece. This is similar to the situation where high-temperature and high-pressure synthesized IIa-type diamond single crystals, which are relatively brittle because of a small amount of nitrogen impurity in the crystals as compared with high-temperature and high-pressure synthesized Ib-type diamond single crystals, are rarely used in cutting tool applications in spite of their possibilities of relatively high hardness and long life.

CITATION LIST

Patent Literature

PTL 1: Japanese Patent No. 4344244
PTL 2: Japanese Unexamined Patent Application Publication No. 2008-207334

Non Patent Literature

NPL 1: Rizwan U. A. Khan et al., Color alterations in CVD synthetic diamond with heat and UV exposure: implications for color grading and identification, Gem & Gemology, spring 2010 pp. 18-26

SUMMARY OF INVENTION

Technical Problem

As described above, known CVD diamond single crystals have lower toughness than natural diamonds or high-temperature and high-pressure synthesized Ib-type diamonds and have limited applications because of their difficulty in processing and likelihood of having cracks or chips. Single crystal diamond tools that include known CVD diamond single crystals are more likely to crack or chip during cutting than tools that include natural diamonds or high-temperature and high-pressure synthesized Ib diamonds. These problems are responsible for limited applications of CVD diamond single crystals.

It is an object of the present invention to solve such problems of the related art and provide a diamond single crystal that has high hardness and high toughness, is easy to process in the manufacture of a tool, has cracking or chipping resistance equal to or higher than the cracking or chipping resistance of tools that include natural diamonds or high-temperature and high-pressure synthesized Ib diamonds, and has long life and high fracture resistance in cutting, a single crystal diamond tool, and a method for producing the diamond single crystal.

Solution to Problem

In order to solve the problems described above, the present invention includes the following aspects.

(1) A diamond single crystal according to the present invention is a diamond single crystal that is synthesized using a chemical vapor synthesis method and has an absorption coefficient of 25 $cm^{-1}$ or more and 80 $cm^{-1}$ or less for light having a wavelength of 350 nm.

(5) A method for producing a diamond single crystal according to the present invention includes implanting an ion other than carbon into a main surface of a diamond single crystal seed substrate and thereby decreasing the transmittance of light having a wavelength of 800 nm, the main surface having an off-angle of 7 degrees or less with respect to a {100} plane, and homoepitaxially growing a diamond single crystal on the ion-implanted main surface of the seed substrate using a chemical vapor synthesis method under synthesis conditions where the ratio $N_C/N_H$ of the number of carbon-containing molecules $N_C$ to the number of hydrogen molecules $N_H$ in a gas phase is 10% or more and 40% or less, the ratio $N_N/N_C$ of the number of nitrogen molecules $N_N$ to the number of carbon-containing molecules $N_C$ in the gas phase is 0.1% or more and 10% or less, and the seed substrate temperature T is 850° C. or more and less than 1000° C.

The number of carbon-containing molecules refers to the number of methane molecules when the carbon-containing molecule is a methane gas or the number of ethane molecules when the carbon-containing molecule is an ethane gas.

(9) A diamond single crystal according to the present invention is a single crystal diamond tool that has a cutting edge made of a diamond single crystal. The cutting edge has a rake face formed of a main surface of the diamond single crystal, and the main surface has an absorption coefficient of less than 25 $cm^{-1}$ for light having a wavelength of 350 nm.

Advantageous Effects of Invention

The present invention can provide a diamond single crystal that has high hardness and high toughness, is easy to process in the manufacture of a tool, has cracking or chipping resistance equal to or higher than the cracking or chipping resistance of tools that include natural diamonds or high-temperature and high-pressure synthesized Ib diamonds, and has long life and high fracture resistance in cutting, a single crystal diamond tool, and a method for producing the diamond single crystal.

DESCRIPTION OF EMBODIMENTS

Figure 1:
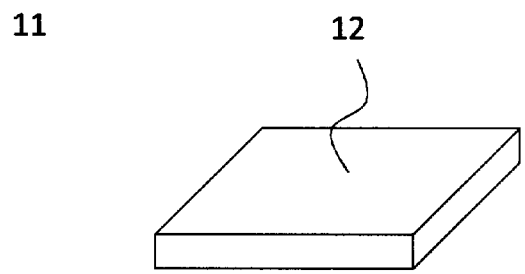
FIG. 1 is a view of a seed substrate for use in a manufacturing method according to the present invention.

First, embodiments of the present invention are listed below.

(1) A diamond single crystal according to the present invention is a diamond single crystal synthesized using a chemical vapor synthesis method and has an absorption coefficient of 25 $cm^{-1}$ or more and 80 $cm^{-1}$ or less for light having a wavelength of 350 nm.

(2) In the diamond single crystal according to (1), the absorption coefficient is preferably 30 $cm^{-1}$ or more and 80 $cm^{-1}$ or less.

A diamond single crystal having a light absorption coefficient of 25 $cm^{-1}$ or more and 80 $cm^{-1}$ or less (at a wavelength of 350 nm) as determined from transmittance measured, for example, with an ultraviolet-visible spectrophotometer has processability and cracking or chipping resistance equal to or higher than those of natural diamonds or high-temperature and high-pressure synthesized Ib diamonds. In addition, it was found that a diamond single crystal having an absorption coefficient of 30 $cm^{-1}$ or more and 80 $cm^{-1}$ or less for light having a wavelength of 350 nm has higher processability and cracking or chipping resistance than natural diamonds or high-temperature and high-pressure synthesized Ib diamonds.

(3) A diamond single crystal according to the present invention is a diamond single crystal produced by gas-phase synthesis. The diamond single crystal includes two or more diamond monocrystalline layers having different absorption coefficients for light having a wavelength of 350 nm. One of the diamond monocrystalline layers having one main surface has an absorption coefficient of less than 25 $cm^{-1}$ for light having a wavelength of 350 nm, and another of the diamond monocrystalline layers having the other main surface has an absorption coefficient of 25 $cm^{-1}$ or more and 80 $cm^{-1}$ or less for light having a wavelength of 350 nm. Any of the two or more diamond monocrystalline layers has an absorption coefficient of 80 $cm^{-1}$ or less for light having a wavelength of 350 nm.

It was found that when the diamond monocrystalline layer having one main surface has an absorption coefficient of less than 25 $cm^{-1}$ for light having a wavelength of 350 nm, the diamond monocrystalline layer having the other main surface has an absorption coefficient of 25 $cm^{-1}$ or more and 80 $cm^{-1}$ or less for light having a wavelength of 350 nm, and any of the two or more diamond monocrystalline layers has an absorption coefficient of 80 $cm^{-1}$ or less for light having a wavelength of 350 nm, the diamond monocrystalline layer having a lower absorption coefficient can very effectively achieve high hardness and high toughness, and the diamond single crystal can have characteristics superior to the characteristics of high-temperature and high-pressure synthesized Ib-type diamond single crystals generally used in tool applications.

(4) In the diamond single crystal according to (3), the diamond single crystal preferably includes two or more diamond monocrystalline layers, and the absorption coefficient for light having a wavelength of 350 nm preferably increases monotonically from the diamond monocrystalline layer having one main surface and having an absorption coefficient of less than 25 $cm^{-1}$ for light having a wavelength of 350 nm to the diamond monocrystalline layer having the other main surface and having an absorption coefficient of 25 cm$^{-1}$ or more and 80 cm$^{-1}$ or less for light having a wavelength of 350 nm.

It was found that the above-mentioned effects are more remarkable when the diamond single crystal includes two or more diamond monocrystalline layers, and the absorption coefficient for light having a wavelength of 350 nm increases monotonically from the diamond monocrystalline layer having one main surface and having an absorption coefficient of less than 25 cm$^{-1}$ for light having a wavelength of 350 nm to the diamond monocrystalline layer having the other main surface and having an absorption coefficient of 25 cm$^{-1}$ or more and 80 cm$^{-1}$ or less for light having a wavelength of 350 nm.

(5) A method for producing a diamond single crystal according to the present invention includes implanting an ion other than carbon into a main surface of a diamond single crystal seed substrate and thereby decreasing the transmittance of light having a wavelength of 800 nm, the main surface having an off-angle of 7 degrees or less with respect to a {100} plane, and homoepitaxially growing a diamond single crystal on the ion-implanted main surface of the seed substrate using a chemical vapor synthesis method under synthesis conditions where the ratio $N_C/N_H$ of the number of carbon-containing molecules $N_C$ to the number of hydrogen molecules $N_H$ in a gas phase is 10% or more and 40% or less, the ratio $N_N/N_C$ of the number of nitrogen molecules $N_N$ to the number of carbon molecules $N_C$ is 0.1% or more and 10% or less, and the seed substrate temperature T is 850° C. or more and less than 1000° C.

As a result of extensive studies to solve the problems described above, the present inventors have found that a diamond single crystal produced by implanting an ion other than carbon into a deeper position of a diamond single crystal seed substrate than a main surface of the diamond single crystal seed substrate through the main surface, for example, with an ion implantation apparatus, destroying the crystalline structure of the diamond single crystal and forming graphite, thereby decreasing the transmittance of light having a wavelength of 800 nm, and homoepitaxially growing the diamond single crystal on a surface having a diamond structure that remains unbroken on the main surface of the ion-implanted seed substrate using a chemical vapor synthesis method, such as a microwave plasma CVD process, under synthesis conditions where the ratio $N_C/N_H$ of the number of carbon-containing molecules $N_C$ to the number of hydrogen molecules $N_H$ in a gas phase is 10% or more and 40% or less, the ratio $N_N/N_C$ of the number of nitrogen molecules $N_N$ to the number of carbon-containing molecules $N_C$ in the gas phase is 0.1% or more and 10% or less, and the seed substrate temperature T is 850° C. or more and less than 1000° C. has higher toughness than known diamond single crystals and has processability and cracking or chipping resistance equal to or higher than those of natural diamonds or high-temperature and high-pressure synthesized Ib diamonds. The main surface of the diamond single crystal seed substrate has an off-angle of 7 degrees or less with respect to a just {100} plane. Use of the diamond single crystal thus produced in a cutting edge of a cutting tool or an abrasion-resistant tool can improve tool performance, such as cutting edge precision or fracture resistance. In the synthesis conditions for the chemical vapor synthesis method, the pressure is preferably 30 Torr or more and 400 Torr or less, more preferably 65 Torr or more and less than 110 Torr.

(6) The method for producing a diamond single crystal according to (5) preferably further includes homoepitaxially growing a diamond single crystal on the growth surface, on which the diamond single crystal has been homoepitaxially grown, using a chemical vapor synthesis method under synthesis conditions where the ratio $N_C/N_H$ of the number of carbon-containing molecules $N_C$ to the number of hydrogen molecules $N_H$ in a gas phase is more than 0% and less than 10%, the ratio $N_N/N_C$ of the number of nitrogen molecules $N_N$ to the number of carbon-containing molecules $N_C$ is less than 0.1%, and the seed substrate temperature T is less than 1000° C. The pressure in this step is preferably 30 Torr or more and 400 Torr or less, more preferably 110 Torr or more and 400 Torr or less.

The present inventors found that diamond single crystals produced using a gas-phase synthesis method and having different absorption coefficients for light having a wavelength of 350 nm have different hardness and toughness. The present inventors also found that an increase in absorption coefficient of 80 cm$^{-1}$ or less for light having a wavelength of 350 nm results in decreased hardness and improved toughness. Since a diamond single crystal is epitaxially grown on a diamond single crystal seed substrate by gas-phase synthesis, the synthesis conditions can be changed to form a diamond single crystal that includes a plurality of layers having drastically different absorption coefficients in the growth direction, that is, in the thickness direction. Thus, a diamond single crystal that includes two or more layers having different absorption coefficients, that is, different hardness and toughness can be formed. It was found that in the diamond single crystal thus produced, like a Japanese sword, the toughness of a layer having a low absorption coefficient and high hardness but low toughness is compensated for with an underlying layer having a high absorption coefficient and low hardness but high toughness, and therefore high hardness and high toughness, which are not achieved in a monolayer diamond single crystal, can be achieved.

It was found that such a diamond single crystal can be produced as described above. More specifically, such a diamond single crystal can be produced by implanting an ion other than carbon into a deeper position of a diamond single crystal seed substrate than a main surface of the diamond single crystal seed substrate through the main surface, for example, with an ion implantation apparatus, destroying the crystalline structure of the diamond single crystal and forming graphite, thereby decreasing the transmittance of light having a wavelength of 800 nm; homoepitaxially growing the diamond single crystal on a surface having a diamond structure that remains unbroken on the main surface of the ion-implanted seed substrate using a chemical vapor synthesis method, such as a microwave plasma CVD process, under synthesis conditions where the ratio $N_C/N_H$ of the number of carbon-containing molecules $N_C$ to the number of hydrogen molecules $N_H$ in a gas phase is 10% or more and 40% or less, the ratio $N_N/N_C$ of the number of nitrogen molecules $N_N$ to the number of carbon-containing molecules $N_C$ in the gas phase is 0.1% or more and 10% or less, and the seed substrate temperature T is 850° C. or more and less than 1000° C.; homoepitaxially growing a diamond single crystal on the growth surface using a chemical vapor synthesis method, such as a microwave plasma CVD process, under synthesis conditions where the $N_C/N_H$ is more than 0% and less than 10% or the $N_N/N_C$ is less than 0.1% and the seed substrate temperature T is less than 1000° C.; and separating the seed substrate from the diamond single crystal grown on the seed substrate by electrochemically etching the graphite layer by laser slicing or ion implantation. The main surface of the diamond single crystal seed substrate has an off-angle of 7 degrees or less with respect to the just {100} plane. It was found that in the diamond single crystal thus produced, the monocrystalline layer having a low absorption coefficient has higher hardness and toughness than known CVD diamond single crystals, and the diamond single crystal has higher processability and cracking or chipping resistance than natural diamonds or high-temperature and high-pressure synthesized Ib diamonds.

(7) In a method for producing a diamond single crystal according to (5) or (6), the off-angle is preferably 3 degrees or less, more preferably 0.5 degrees or less.

It was found that when the main surface of the diamond single crystal seed substrate has an off-angle of 3 degrees or less, preferably 0.5 degrees or less, with respect to the just {100} plane, among island growth and step-flow growth, which are growth modes in homoepitaxial growth, the step-flow growth responsible for low toughness can be further suppressed as compared with the case where the main surface of the diamond single crystal seed substrate has an off-angle of 7 degrees or less, and therefore the diamond single crystal has higher processability and cracking or chipping resistance than natural diamonds or high-temperature and high-pressure synthesized Ib diamonds.

(8) The method for producing a diamond single crystal according to any one of (5) to (7) preferably further includes separating the seed substrate from the diamond single crystal homoepitaxially grown on the seed substrate.

After a diamond single crystal is homoepitaxially grown on the seed substrate, the seed substrate and the diamond single crystal grown on the seed substrate can be separated by electrochemically etching the graphite layer by laser slicing or ion implantation. Such a step of separating the seed substrate from the diamond single crystal allows the seed substrate to be reused.

(9) A single crystal diamond tool according to the present invention is a single crystal diamond tool that has a cutting edge made of the diamond single crystal according to (3) or (4). The cutting edge has a rake face formed of a main surface of the diamond single crystal, and the main surface has an absorption coefficient of less than 25 $cm^{-1}$ for light having a wavelength of 350 nm.

In the resulting diamond single crystal that includes a plurality of diamond monocrystalline layers having different absorption coefficients, a monocrystalline layer that has a low absorption coefficient has high toughness, which is not achieved in a monolayer diamond single crystal, can be achieved. Thus, the diamond single crystal has both high hardness and high toughness. Thus, it was found that cutting tools and abrasion-resistant tools manufactured using such a diamond single crystal have longer lives and higher cracking or chipping resistance than cutting tools and abrasion-resistant tools manufactured using known diamond single crystals, such as high-temperature and high-pressure synthesized Ib-type diamond single crystals or natural diamond single crystals.

In particular, it was found that in a diamond single crystal bit manufactured using such a diamond single crystal that includes a plurality of diamond monocrystalline layers having different absorption coefficients, the formation of a rake face on a high hardness and high toughness main surface having a lower absorption coefficient for light having a wavelength of 350 nm can very effectively achieve long-life and high cracking or chipping resistance.

(10) A single crystal diamond tool according to the present invention is a single crystal diamond tool that includes a diamond single crystal joined to a shank of the tool, wherein the diamond single crystal includes an ion-implanted layer formed by ion implantation into a crystal face on the side of the diamond single crystal to be joined to the shank.

(11) The single crystal diamond tool according to (10) is preferably a single crystal diamond cutting tool.

First, cracking or chipping of a cutting edge of known single crystal diamond tools during cutting is probably caused as described below. In a single crystal diamond tool, a single crystal diamond insert is firmly brazed to a metal shank, for example, with a silver solder. During cutting, cutting force is applied to the cutting edge of the single crystal diamond insert, and stress is applied to the bottom of the single crystal diamond insert so as to separate the single crystal diamond insert from the shank. Considerable stress is also applied to a cutting portion of the insert. Under such conditions, when large spike-like cutting force originating from a particular point of a workpiece impacts on a point of the cutting portion, the cutting portion may not withstand the force and has a minute chip or crack.

Such a defect in the insert cutting edge is very small, and cutting is usually continued. However, the defect increases the surface roughness of the workpiece. In the case of cutting with a single crystal diamond tool, however, attention has often focused on low surface roughness, that is, the degree of mirror finish of the workpiece. Thus, natural diamonds or high-temperature and high-pressure synthesized Ib diamonds are used as materials that are less responsible for minor defects. In contrast, high-temperature and high-pressure synthesized IIa or CVD diamond single crystals tend to be relatively hard and brittle and are rarely used.

In order to solve the problem of limited applications of CVD diamond single crystals, which can be produced in quantity at low cost, the present inventors performed extensive studies. As a result, the present inventors found that in a single crystal diamond tool manufactured by implanting an ion through a crystal face of a gas-phase-synthesized diamond single crystal to be joined to a shank, forming an ion-implanted layer at a slightly deeper position than the crystal face, and joining the diamond single crystal to the shank by brazing, since the ion-implanted layer acts as an impact relaxation layer during cutting, the single crystal diamond tool has cracking or chipping resistance equal to or higher than the cracking or chipping resistance of tools that include natural diamonds or high-temperature and high-pressure synthesized Ib diamonds. Thus, although a single crystal diamond tool according to the present invention includes a diamond single crystal as an insert of the tool, the single crystal diamond tool has improved tool performance, such as high fracture resistance.

It was found that such an impact relaxation effect of the ion-implanted layer is particularly significant in single crystal diamond cutting tools among single crystal diamond tools.

(12) In the single crystal diamond tool according to (10) or (11), the transmittance of light having a wavelength of 800 nm in a direction perpendicular to the ion-implanted layer in the diamond single crystal having the ion-implanted layer preferably changes 10% or more due to removal of the ion-implanted layer.

Such an ion-implanted layer in which the transmittance of light having a wavelength of 800 nm in a direction perpendicular to the ion-implanted layer changes 10% or more due to removal of the ion-implanted layer is preferred because graphite formed by destroying the diamond crystalline structure in the ion-implanted layer has a more effective impact relaxation effect.

(13) In the single crystal diamond tool according to any one of (10) to (12), the diamond single crystal before the ion implantation preferably has an absorption coefficient of 25 cm$^{-1}$ or more and 80 cm$^{-1}$ or less for light having a wavelength of 350 nm in a direction perpendicular to a face of the diamond single crystal on which the ion-implanted layer is to be formed.

It was found that when the diamond single crystal has an absorption coefficient of 25 cm$^{-1}$ or more and 80 cm$^{-1}$ or less for light having a wavelength of 350 nm after removal of the ion-implanted layer, many defects, such as a vacancy, a hydrogen atom, a nitrogen atom, or a complex thereof, present in the diamond single crystal tends to block the propagation of crystal destruction and increase the toughness of the diamond single crystal. In combination with an ion-implanted layer according to the present invention, the diamond single crystal has higher cracking or chipping resistance than tools that include natural diamonds or high-temperature and high-pressure synthesized Ib diamonds.

Preferred embodiments of a diamond single crystal, a method for producing the diamond single crystal, and a single crystal diamond tool according to the present invention will be described in detail below with reference to the accompanying drawings. Like reference numerals designate like parts throughout the drawings, and the description will not be repeated. The dimensions in the figures are not necessarily consistent with their descriptions.

[Preparation of Diamond Single Crystal Seed Substrate]

First, for example, a diamond single crystal seed substrate 11 illustrated in FIG. 1 is prepared. Although a high-temperature and high-pressure synthesized diamond single crystal (HPHT) is preferred because of its relatively small crystal strain, a CVD diamond single crystal (CVD) may also be used. The thickness of the seed substrate is preferably 100 μm or more for convenience in handling and 3 mm or less in terms of availability. The thickness of the seed substrate is measured in the vicinity of the center of the main surface of the seed substrate.

The main surface 12 is a {100} plane, and the surface roughness Ra is preferably 40 nm or less. An Ra of more than 40 nm may result in cracking in a diamond single crystal grown on the main surface.

In the present invention, the case of an off-angle of 7 degrees or less with respect to a {100} just plane is referred to as a {100} plane. The purpose of controlling the off-angle within 7 degrees or less is to provide a diamond monocrystalline layer having an absorption coefficient of 25 cm$^{-1}$ or more and 80 cm$^{-1}$ or less for light having a wavelength of 350 nm according to the present invention by suppressing step-flow growth responsible for low toughness, which is an undesirable property for most of the diamond single crystal cutting tools, among island growth and step-flow growth, which are crystal growth modes in homoepitaxial growth of a diamond single crystal on the main surface 12. The off-angle is preferably 3 degrees or less, more preferably 0.5 degrees or less, in order to further suppress the step-flow growth.

The shape of the main surface 12 is typically tetragonal and may be polygonal or circular.

With respect to the optical properties of the diamond single crystal seed substrate 11, before the front main surface 12 on which a diamond single crystal is to be epitaxially grown or the back main surface is roughened to an Ra of 100 nm or more, for example, by ion etching or before a defect is formed in the crystal, for example, by ion implantation, light transmittance at a wavelength of 800 nm measured with an ultraviolet-visible spectrophotometer is preferably more than 0%. A black seed substrate having a light transmittance of 0% is unsuitable because of poor crystal quality and no epitaxial growth in vapor phase growth.

[Ion Implantation]

Ions are then implanted into the seed substrate 11 through the main surface 12 of the diamond single crystal seed substrate 11 thus prepared to destroy the diamond crystalline structure and form graphite, thereby decreasing light transmittance at a wavelength of 800 nm as compared with light transmittance before the ion implantation. The purpose of the ion implantation treatment is to moderately destroy the diamond crystal structure on the uppermost surface layer of the main surface 12 and introduce a point defect, thereby allowing the quality of a diamond single crystal epitaxially grown on the main surface 12 to be a diamond single crystal according to the present invention. In particular, the purpose of the ion implantation treatment is to realize a diamond monocrystalline layer having an absorption coefficient of 25 cm$^{-1}$ or more and 80 cm$^{-1}$ or less for light having a wavelength of 350 nm. The term "moderately", as used herein, means that the diamond structure is maintained such that epitaxial growth is possible over the entire surface of the main surface 12 in diamond single crystal growth in a downstream process. Growth of a diamond other than diamond single crystals, such as a polycrystalline diamond, on even a portion of the main surface 12 is outside the scope of the present invention.

Under the ion implantation conditions where the ion-implanted main surface has the surface state as described above, any ionic species to be implanted, any implantation energy, and any implantation dose can be selected. In ion implantation of carbon, which is an element constituting diamond, at the temperature of epitaxial growth of a diamond monocrystalline layer having an absorption coefficient of 25 cm$^{-1}$ or more and 80 cm$^{-1}$ or less for light having a wavelength of 350 nm in the next step (850° C. or more and less than 1000° C.), the surface state of the crystalline structure undesirably returns to the surface state that the crystalline structure had before the implantation. The ion implantation temperature is less than 1000° C. In general, implantation does not increase the temperature to 1000° C. even without temperature control. Thus, implantation is performed without temperature control. Ion implantation treatment without epitaxial growth is outside the scope of the present invention.

The surface state having the moderately destroyed structure can be efficiently realized at a low dose or in a short time when the implantation depth is small. Thus, a larger mass and lower energy are preferred. More specifically, the implantation depth is preferably 1 μm or less, more preferably 0.5 μm or less. More specific implantation conditions include $1 \times 10^{14}$ to $0.8 \times 10^{17}$ cm$^{-2}$ when the ionic species is boron (mass number 11) and the energy is 175 keV, or $1 \times 10^{13}$ to $5 \times 10^{16}$ cm$^{-2}$ when the ionic species is silicon (mass number 28), phosphorus (mass number 31), or sulfur (mass number 32) and the energy is 300 keV, for example. Thus, silicon, phosphorus, and sulfur are preferred over boron, carbon, and nitrogen.

Light transmittance at a wavelength of 800 nm is measured after implantation to check for a decrease in light transmittance. The decrease in transmittance of light having a wavelength of 800 nm due to ion implantation should be more than 0%. The decrease is preferably 10% or more, more preferably 20% or more.

The decrease in transmittance of light having a wavelength of 800 nm due to ion implantation is defined as follows:

Decrease={(transmittance before ion implantation)−(transmittance after ion implantation)}/(transmittance before ion implantation)×100

[Diamond Single Crystal Growth]

A diamond single crystal is then grown on a seed substrate, which is disposed on a substrate holder in a diamond CVD growth furnace. The growth method may be a hot-filament method, a combustion flame method, or an arc jet method and is preferably a microwave plasma method in order to produce a diamond containing a less amount of unintended impurities.

In the epitaxial growth of a diamond using microwave plasma CVD, hydrogen, methane, and nitrogen are introduced as raw material gases into a synthesis furnace. The furnace pressure is maintained in the range of 30 to 400 Torr. A microwave having a frequency of 2.45 GHz (±50 MHz) or 915 MHz (±50 MHz) is applied at an electric power in the range of 100 W to 60 kW to generate plasma and deposit active species on the seed substrate, thereby epitaxially growing a diamond single crystal. As described above, the furnace pressure is preferably 30 Torr or more and 400 Torr or less, more preferably 65 Torr or more and less than 110 Torr.

Under the synthesis conditions of a diamond single crystal according to the present invention, the ratio of hydrogen, methane, and nitrogen introduced into a synthesis gas phase is such that the ratio $N_C/N_H$ of the number of carbon-containing molecules $N_C$ to the number of hydrogen molecules $N_H$ is 10% or more and 40% or less and the ratio $N_N/N_C$ of the number of nitrogen molecules $N_N$ to the number of carbon-containing molecules $N_C$ is 0.1% or more and 10% or less, and the seed substrate temperature T for heating the seed substrate with plasma is 850° C. or more and less than 1000° C. The diamond single crystal thus produced has an absorption coefficient of 25 $cm^{-1}$ or more and 80 $cm^{-1}$ or less for light having a wavelength of 350 nm. The absorption coefficient is preferably 30 $cm^{-1}$ or more and 80 $cm^{-1}$ or less, more preferably 35 $cm^{-1}$ or more and 64 $cm^{-1}$ or less. $N_C/N_H$, $N_N/N_C$, and T outside these ranges, omission of the ion implantation step, or a step of changing the surface state of a main surface, for example, by annealing at 1000° C. or more between the ion implantation step and the diamond single crystal growth step results in an absorption coefficient of less than 25 $cm^{-1}$ or more than 80 $cm^{-1}$ for light having a wavelength of 350 nm.

In order to produce a diamond single crystal that includes a plurality of diamond monocrystalline layers having different absorption coefficients for light having a wavelength of 350 nm, in the growth step, [1] a diamond monocrystalline layer having an absorption coefficient of 25 $cm^{-1}$ or more and 80 $cm^{-1}$ or less for light having a wavelength of 350 nm is formed, and then [2] a diamond monocrystalline layer having an absorption coefficient of less than 25 $cm^{-1}$ for light having a wavelength of 350 nm is formed. This is because the formation of the layer of [1] requires epitaxial growth on a surface of a substrate having a decreased transmittance for light having a wavelength of 800 nm due to ion implantation.

The term "layer", as used herein, refers to a region between a main surface and an interface that halves a region in which the rate of change in absorption coefficient in the thickness direction varies at 1 $cm^{-1}$/0.1 μm or more in the thickness direction or refers to a region between one interface and another interface. Even in the presence of an absorption coefficient change of less than 1 $cm^{-1}$/0.1 μm in a layer, the average absorption coefficient is calculated while considering the layer as one layer.

When the [1] diamond monocrystalline layer having an absorption coefficient of 25 $cm^{-1}$ or more and 80 $cm^{-1}$ or less for light having a wavelength of 350 nm is grown, as described above, the ratio of hydrogen, methane, and nitrogen introduced into a synthesis gas phase is such that the ratio $N_C/N_H$ of the number of carbon-containing molecules $N_C$ to the number of hydrogen molecules $N_H$ is 10% or more and 40% or less and the ratio $N_N/N_C$ of the number of nitrogen molecules $N_N$ to the number of carbon-containing molecules $N_C$ is 0.1% or more and 10% or less, and the seed substrate temperature T for heating the seed substrate with plasma is 850° C. or more and less than 1000° C. The synthesis pressure is preferably 30 Torr or more and 400 Torr or less, more preferably 65 Torr or more and less than 110 Torr.

When a layer having a particular absorption coefficient is grown, each of the three parameters is fixed during the synthesis. $N_C/N_H$, $N_N/N_C$, and T outside these ranges, omission of the ion implantation step, or a step of changing the surface state of a main surface, for example, by annealing at 1000° C. or more between the ion implantation step and the growth step results in an absorption coefficient of less than 25 $cm^{-1}$ or more than 80 $cm^{-1}$ for light having a wavelength of 350 nm.

When a layer or a plurality of layers having a different absorption coefficient from a layer having a particular absorption coefficient are formed, at least one of the three parameters is changed to synthesize a layer having an absorption coefficient of 25 $cm^{-1}$ or more and 80 $cm^{-1}$ or less for light having a wavelength of 350 nm. The synthesis may be temporarily stopped at the point in time when the layer having the particular absorption coefficient is formed or may be continued with different parameters. The absorption coefficient of the overlaid layer(s) for light having a wavelength of 350 nm is preferably smaller than the absorption coefficient of the underlayer but may be greater than the absorption coefficient of the underlayer. In this case, a layer having an absorption coefficient of more than 80 $cm^{-1}$ for light having a wavelength of 350 nm should not be synthesized.

When the absorption coefficient of the overlaid layer(s) for light having a wavelength of 350 nm is smaller than the absorption coefficient of the underlayer, a diamond single crystal according to the present invention can have high hardness and high toughness.

The [2] diamond monocrystalline layer having an absorption coefficient of less than 25 $cm^{-1}$ for light having a wavelength of 350 nm is then grown. The ratio of hydrogen, methane, and nitrogen introduced into the synthesis gas phase is such that the $N_C/N_H$ is more than 0% and less than 10% or the $N_N/N_C$ is less than 0.1%, and T is less than 1000° C.

At T of 1000° C. or more, the [1] diamond monocrystalline layer having an absorption coefficient of 25 $cm^{-1}$ or more and 80 $cm^{-1}$ or less for light having a wavelength of 350 nm grown earlier may be annealed and have an absorption coefficient of less than 25 $cm^{-1}$. In general, T is not more than the synthesis temperature of [1] grown earlier so as not to change the absorption coefficient of the layer formed in [1].

When the layer having the particular absorption coefficient is grown, the three parameters are fixed. $N_C/N_H$, $N_N/N_C$, or T outside these ranges undesirably results in an absorption coefficient of 25 cm$^{-1}$ or more for light having a wavelength of 350 nm or a diamond/graphite composite layer having graphite black spots in the crystal.

As described above, when a layer or a plurality of layers having a different absorption coefficient from a layer having a particular absorption coefficient are formed, at least one of the three parameters is changed in the synthesis, and a layer having an absorption coefficient of less than 25 cm$^{-1}$ for light having a wavelength of 350 nm is finally synthesized. The synthesis may be temporarily stopped at the point in time when the layer having the particular absorption coefficient is formed or may be continued with different parameters.

[Separation Between Seed Substrate and Diamond Single Crystal]

After the completion of growth of the monolayer or multilayer diamond monocrystalline layer, the diamond single crystal is removed from the CVD growth furnace, and the seed substrate is preferably separated from the diamond single crystal grown on the seed substrate. Although the diamond single crystal in which the seed substrate is bonded to the diamond single crystal grown on the seed substrate can also be used, it is more preferable to separate the seed substrate from the diamond single crystal and use the CVD grown diamond single crystal.

When the main surface size of the diamond single crystal is approximately 10 mm square or less, the seed substrate can be separated from the diamond single crystal by laser slicing, and the laser cut surface can be polished. When the main surface size is more than 10 mm square, the seed substrate or the diamond single crystal is likely to be broken by laser cutting, and the graphite layer formed in the seed substrate in the ion implantation step can be subjected to electrochemical etching to separate the seed substrate from the diamond single crystal. In the case where it is not necessary to recover or reuse the seed substrate, the seed substrate may be removed by polishing or reactive ion etching.

In order to accurately measure the absorption coefficient of each layer for light having a wavelength of 350 nm, the diamond single crystal separated from the seed substrate is treated, for example, by polishing such that the parallelism of the main surfaces is 10 μm or less and the surface roughness is 40 nm or less. In the case where the diamond single crystal thus produced is monolayer, the diamond single crystal has an absorption coefficient of 25 cm$^{-1}$ or more and 80 cm$^{-1}$ or less for light having a wavelength of 350 nm. In the case where the diamond single crystal thus produced is multilayer, the diamond single crystal is composed of two or more diamond monocrystalline layers having different absorption coefficients for light having a wavelength of 350 nm. One of the diamond monocrystalline layers having one main surface has an absorption coefficient of less than 25 cm$^{-1}$ for light having a wavelength of 350 nm, and another of the diamond monocrystalline layers having the other main surface has an absorption coefficient of 25 cm$^{-1}$ or more and 80 cm$^{-1}$ or less for light having a wavelength of 350 nm.

The absorption coefficient α of the monolayer diamond single crystal is calculated using the following equation.

$$t_{ex} = t^2/(1-r^2) \times \exp(-\alpha L)$$

α: Absorption coefficient
$t_{ex}$: External transmittance (transmittance measured with ultraviolet-visible spectrophotometer, for example)
t: Internal transmittance=0.83
r: Reflectance=0.17
L: Distance or thickness between main surfaces of diamond single crystal The absorption coefficient of the multilayer diamond single crystal is calculated using the following equation after the measurement of external transmittance and repeated removal by etching or polishing of the uppermost surface layer.

$$t_{ex} = t^2/(1-r^2) \times \exp(-\alpha_1 L_1 - \alpha_2 L_2 - \alpha_3 L_3 \ldots \alpha_n L_n)$$

$t_{ex}$: External transmittance (transmittance measured with ultraviolet-visible spectrophotometer, for example)
t: Internal transmittance=0.83
r: Reflectance=0.17
n: n=1 refers to a diamond monocrystalline layer including the main surface and having an absorption coefficient of 25 cm$^{-1}$ or more and 80 cm$^{-1}$ or less for light having a wavelength of 350 nm, and n refers to an n-th grown diamond monocrystalline layer.
$\alpha_n$: Absorption coefficient of n-th grown diamond monocrystalline layer
$L_n$: Thickness of n-th grown diamond monocrystalline layer If there is an ideal diamond single crystal free of impurities, the diamond single crystal has an absorption coefficient of 0 cm$^{-1}$ for light having a wavelength of 350 nm. However, realistically, irrespective of the synthesis method, such as high-temperature and high-pressure synthesis or gas-phase synthesis, crystals grow while incorporating impurities, such as nitrogen, hydrogen, and nickel, and vacancies into the crystals, and these impurities and vacancies absorb light. Absorption of light having a wavelength of 350 nm by diamond single crystals is probably because of complex defects of nitrogen, vacancies, and hydrogen incorporated into the crystals during CVD growth. With an increase in absorption, the apparent color changes light brown→brown→dark brown→black, and deviates from the color of transparent diamond jewelry, which is generally considered to be expensive.

For example, when having a thickness of 1 mm, a diamond single crystal having an absorption coefficient of 25 cm$^{-1}$ or more and 80 cm$^{-1}$ or less according to the present invention apparently assumes a brown to black color. In addition to being of low value in appearance, growth using a conventional technique requires a lower temperature T, higher $N_C/N_H$, or higher $N_N/N_C$ than the synthesis conditions described in the present invention. Thus, there is a technical problem that graphite/diamond composite materials including many graphite black spots in the crystal are only produced.

The present inventors thought that diamond single crystals having more defects than known CVD diamond single crystals and substantially free of graphite black spots may have slightly low hardness because of decreased integrity of the crystals but have improved toughness because the defects block the propagation of crystal destruction. The present inventors thought that this may solve the problems of known CVD diamond single crystals that they are more brittle than natural diamond single crystals or high-temperature and high-pressure synthesized Ib-type diamond single crystals, are difficult to process into the shape of tools, such as bits and end mills, and tend to chip or crack during processing of workpiece.

In order to realize such diamond single crystals, the problem that graphite/diamond composite materials synthesized using a conventional technique always have many black spots must be solved.

As a result of extensive studies, the present inventors thought that a proper number of point defects formed in advance on a surface of a CVD grown seed substrate can result in growth of a diamond single crystal containing many point defects through which much hydrogen and nitrogen are incorporated into the diamond single crystal even under synthesis conditions where diamond single crystals containing no graphite black spot are grown. The present inventors found that in order that point defects are not repaired and remain even when preheated to 850° C. or more and less than 1000° C., which is a growth temperature of a diamond single crystal according to the present invention, before growth, defects that allow epitaxial growth on a surface are introduced by implantation of an ion other than carbon, such as nitrogen, fluorine, neon, silicon, phosphorus, sulfur, chlorine, argon, or arsenic.

As a result, a diamond single crystal that has an absorption coefficient of 25 $cm^{-1}$ or more and 80 $cm^{-1}$ or less for light having a wavelength of 350 nm, has high toughness, and is substantially free of graphite black spots is realized. When the absorption coefficient is less than 25 $cm^{-1}$, the diamond single crystal has low toughness and low fracture resistance and is therefore generally unsuitable for tool applications. When the absorption coefficient is more than 80 $cm^{-1}$, the diamond single crystal has too many defects to maintain its diamond structure, becomes brittle, and is therefore unsuitable for tool applications. A diamond single crystal according to the present invention is substantially free of graphite by its very nature. The term "substantially", as used herein, means that no graphite black spot is observed throughout the diamond single crystal at a magnification of 20.

Furthermore, the present inventors thought that among island growth and step-flow growth, which are growth modes in homoepitaxial growth, the step-flow growth responsible for low toughness can be minimized to grow a diamond single crystal suitable for tool applications, and a main surface of a diamond single crystal seed substrate to be CVD grown should have an off-angle of 7 degrees or less, more preferably 3 degrees or less, still more preferably 0.5 degrees or less, with respect to a just {100} plane.

As a result, a diamond single crystal that has an absorption coefficient of 25 $cm^{-1}$ or more and 80 $cm^{-1}$ or less for light having a wavelength of 350 nm, has high toughness suitable for cutting tool applications, and is substantially free of graphite black spots is realized. The absorption coefficient for light having a wavelength of 350 nm is preferably 30 $cm^{-1}$ or more and 80 $cm^{-1}$ or less.

When the absorption coefficient for light having a wavelength of 350 nm is less than 25 $cm^{-1}$ as in known CVD diamond single crystals, the diamond single crystal has low toughness and low fracture resistance and is therefore generally unsuitable for tool applications. However, as a result of extensive studies, the present inventors found that in a diamond monocrystalline layer having an absorption coefficient of less than 25 $cm^{-1}$ for light having a wavelength of 350 nm disposed on a diamond monocrystalline layer having an absorption coefficient of 25 $cm^{-1}$ or more and 80 $cm^{-1}$ or less for light having a wavelength of 350 nm and having relatively high toughness, like a Japanese sword, the weakness of the layer having high hardness but low toughness is compensated for with the underlying layer having high toughness, and therefore high hardness and high toughness, which are not achieved in a monolayer diamond single crystal, can be achieved.

The diamond single crystal including a plurality of diamond monocrystalline layers having different absorption coefficients is composed of two or more diamond monocrystalline layers having different absorption coefficients for light having a wavelength of 350 nm. One of the diamond monocrystalline layers having one main surface has an absorption coefficient of less than 25 $cm^{-1}$ for light having a wavelength of 350 nm, and another of the diamond monocrystalline layers having the other main surface has an absorption coefficient of 25 $cm^{-1}$ or more and 80 $cm^{-1}$ or less for light having a wavelength of 350 nm. Any of the two or more diamond monocrystalline layers has an absorption coefficient of 80 $cm^{-1}$ or less for light having a wavelength of 350 nm.

Preferably, the absorption coefficient for light having a wavelength of 350 nm increases monotonically from the diamond monocrystalline layer having one main surface and having an absorption coefficient of less than 25 $cm^{-1}$ for light having a wavelength of 350 nm to the diamond monocrystalline layer having the other main surface and having an absorption coefficient of 25 $cm^{-1}$ or more and 80 $cm^{-1}$ or less for light having a wavelength of 350 nm.

In the diamond single crystal including two or more diamond monocrystalline layers, although the absorption coefficient of each layer for light having a wavelength of 350 nm preferably increases monotonically from one main surface to the opposite main surface, the absorption coefficient of each layer may be random instead of the monotonic increase. In this case, any of intermediate layers between the two main surfaces should have an absorption coefficient of 80 $cm^{-1}$ or less for light having a wavelength of 350 nm.

It was also found that when the absorption coefficient for light having a wavelength of 350 nm increases monotonically from one main surface to the opposite main surface, the diamond single crystal can very effectively achieve high hardness and high toughness.

[Preparation and Evaluation of Single Crystal Diamond Tool]

Figure 2:
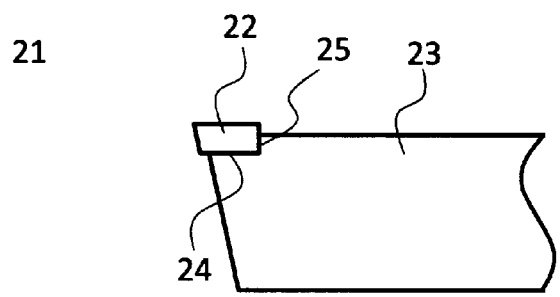
FIG. 2 is a view of the structure of a single crystal diamond tool according to the present invention.

For example, a single crystal diamond tool 21 illustrated in FIG. 2 will be prepared. The single crystal diamond tool 21 includes a diamond single crystal insert 22 formed of a diamond single crystal according to the present invention and a holder 23. A {100} or {110} plane corresponding to a bottom 24 of the diamond single crystal insert 22 is joined, for example, by brazing to a cut portion at one end of the holder 23. A back side 25 of the diamond single crystal insert is generally a {100} plane but may be a {110} plane. When the crystal face of the back side 25 has been determined, the crystal orientation of the diamond single crystal insert 22 with respect to the holder 23 is determined. The bottom 24 of the diamond single crystal insert 22 is a main surface of the diamond single crystal according to the present invention having a larger absorption coefficient (25 $cm^{-1}$ or more and 80 $cm^{-1}$ or less) for light having a wavelength of 350 nm. Thus, the rake face is a main surface having a smaller absorption coefficient (less than 25 $cm^{-1}$). The thickness of the absorption coefficient including the rake face is 100 μM or less. Such a thickness results in markedly high hardness and toughness of the rake face as in a Japanese sword.

A single crystal diamond tool according to the present invention has high hardness and high toughness, which are not achieved using known diamond single crystals. Thus, a single crystal diamond tool according to the present invention has higher hardness than cutting tools manufactured using known high-temperature and high-pressure synthesized Ib-type diamond single crystals and has high abrasion resistance and long life. Because of its higher toughness than cutting tools manufactured using known CVD diamond single crystals, a single crystal diamond tool according to the present invention has high fracture resistance. Because of rare occurrence of micro-chipping during cutting, a workpiece after the cutting has small surface roughness and smoother mirror finish.

A single crystal diamond tool according to an embodiment of the present invention may be any tool that includes a diamond single crystal joined to a shank of the tool and may be a cutting tool, a dresser, or an end mill. Among these, a cutting tool is preferred.

A single crystal diamond cutting tool 31 illustrated in FIG. 3 will be described below. The single crystal diamond cutting tool 31 includes a diamond single crystal insert 32 and a holder 33 serving as a shank. A {100} or {110} plane corresponding to a bottom 34 of the diamond single crystal insert 32 is joined, for example, by brazing to a cut portion at one end of the holder 33. A back side 35 of the diamond single crystal insert is generally a {100} plane but may be a {110} plane. When the crystal face of the back side 35 has been determined, the crystal orientation of the diamond single crystal insert 32 with respect to the holder 33 is determined.

An ion-implanted layer 36 is generally disposed at a depth of 50 μm or less, more preferably 30 μm or less, still more preferably 10 μm or less, from the bottom 34 of the diamond single crystal insert 32 to be joined to the shank.

Ions implanted into a crystal have a concentration distribution in the depth direction. The depth of the ion-implanted layer in the present invention refers to the position at which the implanted ions have a peak concentration in the depth direction of the crystal.

Such a structure, particularly a structure including an ion-implanted layer at a slightly deeper position than the bottom joined by brazing, significantly improves the fracture resistance of a cutting edge as compared with cutting tools manufactured using known CVD diamond single crystals. Thus, such a single crystal diamond cutting tool has tool performance equal to or higher than the tool performance of cutting tools manufactured using high-temperature and high-pressure synthesized Ib-type diamond single crystals. In a single crystal diamond tool according to the present invention, the diamond single crystal may be joined to the shank using any means, including known means.

A diamond single crystal for use in a single crystal diamond tool according to an embodiment of the present invention includes an ion-implanted layer. The ion-implanted layer is formed under predetermined implantation conditions, such as ionic species to be implanted, implantation energy, implantation dose, and implantation angle. The ion-implanted layer is formed in order to destroy the diamond crystal structure in the ion-implanted layer formed by ion implantation and form graphite, thereby lessening sudden impact to a single crystal diamond insert during cutting. Thus, any ionic species that can be implanted into diamond may be selected. For example, ionic species of phosphorus, boron, carbon, hydrogen, helium, nitrogen, oxygen, or argon may be implanted.

The ion implantation conditions are determined such that the diamond structure is maintained on the outermost surface even after an ion-implanted layer is formed. Destruction of the diamond structure on the uppermost surface layer and formation of graphite make brazing of the shank difficult. The position of the implanted layer is preferably as deep as possible. More specifically, the position at which the implanted ionic species in the crystal has a peak concentration is preferably at a depth of 0.20 μm or more, more preferably 0.30 μm or more, still more preferably 0.50 μm or more. Such a deep position ensures joining to the shank by brazing.

The ion-implanted layer thus formed preferably reduces the transmittance of light having a wavelength of 800 nm in a direction perpendicular to the ion-implanted layer of the diamond single crystal as compared with that in a diamond single crystal that includes no ion-implanted layer. A decreased transmittance indicates destruction of the diamond crystalline structure and formation of graphite due to ion implantation. Thus, the ion-implanted layer acts effectively as an impact relaxation layer during cutting. This effect more preferably decreases the transmittance by 10% or more. In this case, the ion-implanted layer more effectively acts as an impact relaxation layer. The decrease in transmittance due to the ion-implanted layer in the present invention is determined using one of the following two methods. Although the same value is generally obtained using the two methods, if different values are obtained, a larger value is employed.

{Method A for Determining Decrease in Transmittance}

1. Remove a diamond single crystal from a single crystal diamond tool.
2. Completely remove a binder, such as a brazing filler, from the diamond single crystal.
3. Measure transmittance in the diamond single crystal (measurement [1]).
4. Remove an ion-implanted layer by polishing or ion etching.
5. Measure transmittance in the diamond single crystal after removal of the ion-implanted layer (measurement [2]).
6. Subtract the measurement [1] from the measurement [2].

{Method B for Determining Decrease in Transmittance}

1. Remove a diamond single crystal from a single crystal diamond tool.
2. Completely remove a binder, such as a brazing filler, from the diamond single crystal.
3. Check for the formation of an ion-implanted layer using secondary ion mass spectrometry (SIMS).
4. Check the ion implantation conditions, for example, using ion implantation simulation (TRIM).
5. Prepare a diamond monocrystalline plate that is different from the diamond single crystal removed from the single crystal diamond tool and both main surfaces of which are polished to a surface roughness of 40 nm or less.
6. Measure transmittance in the diamond monocrystalline plate prepared in 5 (measurement [1]).
7. Implant ions through one main surface of the diamond monocrystalline plate prepared in 5 under the ion implantation conditions checked in 4.
8. Check for the formation of an ion-implanted layer that is substantially the same as the ion-implanted layer observed in 3 on the diamond monocrystalline plate ion-implanted in 7 using, for example, SIMS.
9. Measure transmittance in the diamond monocrystalline plate ion-implanted in 7 (measurement [2]).
10. Subtract the measurement [1] from the measurement [2].

A diamond single crystal for use in a single crystal diamond tool according to an embodiment of the present invention includes an ion-implanted layer. The portion other than the ion-implanted layer preferably has an absorption coefficient of 25 $cm^{-1}$ or more and 80 $cm^{-1}$ or less for light having a wavelength of 350 nm. In other words, a gas-phase-synthesized diamond single crystal before ion implantation preferably has an absorption coefficient of 25 $cm^{-1}$ or more and 80 cm$^{-1}$ or less for light having a wavelength of 350 nm in a direction perpendicular to a face on which the ion-implanted layer is to be formed.

Absorption at 350 nm in a diamond single crystal results from many complex defects of vacancies, hydrogen atoms, and hydrogen atoms in the crystal. These defects tend to block the propagation of crystal destruction associated with cracking or chipping. Because of high toughness of the diamond single crystal, a single crystal diamond tool that includes the diamond single crystal on which an ion-implanted layer is formed has higher cracking or chipping resistance than tools that include natural diamonds or high-temperature and high-pressure synthesized Ib diamonds.

In a diamond single crystal having an absorption coefficient of 25 cm$^{-1}$ or more and 80 cm$^{-1}$ or less for light having a wavelength of 350 nm, although black spots are sometimes observed in the crystal with the naked eye, these black spots do not affect cutting performance, unless the black spots are in the vicinity of the cutting edge. The absorption coefficient is measured as described below.

{Method for Measuring Absorption Coefficient}

1. Remove a diamond single crystal from a single crystal diamond tool.
2. Completely remove a binder, such as a brazing filler, from the diamond single crystal.
3. Remove an ion-implanted layer by polishing or ion etching.
4. Measure transmittance in the diamond single crystal after the ion-implanted layer is removed.
5. Calculate the absorption coefficient α using the equation: $t_{ex}=t^2/(1-r^2)\times\exp(-\alpha L)$.

$t_{ex}$: External transmittance (transmittance measured with ultraviolet-visible spectrophotometer, for example)
t: Internal transmittance=0.83
r: Reflectance=0.17
L: Distance or thickness between main surfaces of diamond single crystal Such a diamond single crystal having an absorption coefficient of 25 cm$^{-1}$ or more and 80 cm$^{-1}$ or less for light having a wavelength of 350 nm can be produced in a CVD process as described above.

EXAMPLES

Although the present invention is more specifically described in the following examples, the present invention is not limited to these examples. The scope of the present invention is defined by the appended claims and embraces all changes that fall within the scope of the claims and the equivalents thereof.

Example 1-1

First, diamond single crystal seed substrates Nos. 1-01 to 1-22 listed in Table I were prepared. Each of these diamond single crystal seed substrates had a size of 4×4×0.5 mm in thickness. Nos. 1-01 to 1-13 were high-temperature and high-pressure synthesized Ib-type diamond single crystal substrates (HPHT Ib). Nos. 1-14 to 1-17 were high-temperature and high-pressure synthesized IIa-type diamond single crystal substrates (HPHT IIa). Nos. 1-18 to 1-22 were gas-phase-synthesized diamond single crystal substrates (CVD).

A 4×4 mm main surface ({100} plane) had a surface roughness Ra of 40 nm or less. Table I shows the off-angle of a main surface of each of the seed substrates on which a diamond single crystal is to be grown in a downstream process, and the transmittance of light having a wavelength of 800 nm.

The transmittance of light having a wavelength of 800 nm through each of the seed substrates was then decreased as shown in Table I by ion implantation through the main surface. With respect to the ion implantation conditions, phosphorus was used as an ionic species, the implantation energy ranged from 100 to 800 keV, and the implantation dose ranged from $1\times10^{13}$ to $5\times10^{15}$ cm$^{-2}$.

A diamond single crystal was epitaxially grown on the ion-implanted main surface. A microwave plasma CVD apparatus was used for the growth. Raw material gases hydrogen, methane, and nitrogen were introduced into the apparatus. The amounts of the gases were adjusted so as to satisfy $N_C/N_H$, $N_N/N_C$, and T listed in Table I in the synthesis. More specifically, $N_C/N_H$ was 10% or more and 40% or less, $N_N/N_C$ was 0.1% or more and 10% or less, T was 850° C. or more and less than 1000° C., and the pressure P was 65 Torr or more and less than 110 Torr.

After the growth, the diamond single crystal was separated from each of the seed substrates by laser cutting. The main surface on the growth surface side and the main surface on the laser cut surface side of the diamond single crystal were polished such that the distance (thickness) between the main surfaces was 1 mm, the parallelism of the main surfaces was 10 µm or less, and the surface roughness Ra was 40 nm or less.

The absorption coefficient of the diamond single crystal produced on each of the seed substrates for light having a wavelength of 350 nm was measured with an ultraviolet-visible spectrophotometer. Table I shows the results. The absorption coefficient ranged from 25 to 80 cm$^{-1}$ when the seed substrate had an off-angle of 7 degrees or less and 30 to 80 cm$^{-1}$ when the seed substrate had an off-angle of 0.5 degrees or less.

Observation of the diamond single crystals with a stereoscopic microscope showed that no black spot due to graphite was observed in any of the diamond single crystals.

Precision bits were manufactured using the diamond single crystals having an absorption coefficient in the range of 25 to 80 cm$^{-1}$ for light having a wavelength of 350 nm. The cutting performance of the precision bits were evaluated.

A cylindrical aluminum alloy AC4B was selected as a workpiece. The periphery of the workpiece was turned 50 km at a cutting speed of 600 m/min under the same conditions. After that, the cutting edge of each of the bits was microscopically observed. The number of chips having a length of 0.5 µm or more was counted in each of the bits in the observation. The number of chips was smaller than or equal to the number of chips counted in the precision bits manufactured using high-temperature and high-pressure synthesized Ib-type diamond single crystals evaluated in the same manner. In particular, the number of chips in a diamond single crystal having an absorption coefficient in the range of 30 to 80 cm$^{-1}$ produced on each of the seed substrates having an off-angle of 0.5 degrees or less was smaller than the number of chips counted in the precision bits manufactured using high-temperature and high-pressure synthesized Ib-type diamond single crystals.

TABLE I

| | | Diamond single crystal seed substrate | | Seed substrate after implantation | CVD diamond growth | | | CVD diamond single crystal | |
|---|---|---|---|---|---|---|---|---|---|
| | | | 800 nm | 800 nm | | | | 350 nm absorption | |
| Number | Type | Off-angle [°] | transmittance [%] | transmittance [%] | $N_C/N_H$ [%] | $N_N/N_C$ [%] | T [° C.] | coefficient [cm$^{-1}$] | Graphite black spots |
| No. 1-01 | HPHT Ib | 7.0 | 70 | 69 | 10 | 0.1 | 995 | 25 | None |
| No. 1-02 | HPHT Ib | 7.0 | 70 | 1 | 40 | 10 | 850 | 50 | None |
| No. 1-03 | HPHT Ib | 5.0 | 70 | 54 | 15 | 0.1 | 990 | 41 | None |
| No. 1-04 | HPHT Ib | 3.0 | 70 | 29 | 20 | 1 | 950 | 52 | None |
| No. 1-05 | HPHT Ib | 2.0 | 70 | 14 | 27 | 3 | 910 | 59 | None |
| No. 1-06 | HPHT Ib | 1.0 | 70 | 5 | 32 | 7 | 870 | 66 | None |
| No. 1-07 | HPHT Ib | 0.6 | 70 | 69 | 10 | 0.1 | 995 | 28 | None |
| No. 1-08 | HPHT Ib | 0.5 | 70 | 69 | 10 | 0.1 | 995 | 30 | None |
| No. 1-09 | HPHT Ib | 0.5 | 70 | 1 | 40 | 10 | 850 | 73 | None |
| No. 1-10 | HPHT Ib | 0.3 | 70 | 50 | 20 | 3 | 930 | 47 | None |
| No. 1-11 | HPHT Ib | 0.1 | 70 | 20 | 30 | 7 | 890 | 64 | None |
| No. 1-12 | HPHT Ib | 0.0 | 70 | 69 | 10 | 0.1 | 995 | 35 | None |
| No. 1-13 | HPHT Ib | 0.0 | 70 | 1 | 40 | 10 | 850 | 80 | None |
| No. 1-14 | HPHT IIa | 7.0 | 70 | 69 | 10 | 0.1 | 995 | 25 | None |
| No. 1-15 | HPHT IIa | 0.6 | 70 | 69 | 10 | 0.1 | 995 | 28 | None |
| No. 1-16 | HPHT IIa | 0.5 | 70 | 69 | 10 | 0.1 | 995 | 30 | None |
| No. 1-17 | HPHT IIa | 0.0 | 70 | 69 | 10 | 0.1 | 995 | 35 | None |
| No. 1-18 | CVD | 7.0 | 70 | 69 | 10 | 0.1 | 995 | 26 | None |
| No. 1-19 | CVD | 0.6 | 50 | 49 | 10 | 0.1 | 995 | 29 | None |
| No. 1-20 | CVD | 0.5 | 30 | 29 | 10 | 0.1 | 995 | 32 | None |
| No. 1-21 | CVD | 0.0 | 10 | 9 | 10 | 0.1 | 995 | 37 | None |
| No. 1-22 | CVD | 0.0 | 2 | 1 | 10 | 0.1 | 995 | 39 | None |

Comparative Example 1-1

As shown in Table II, a diamond single crystal was produced in the same manner as in the example No. 1-01 except that a main surface of the seed substrate had an off-angle of 7.1 degrees with respect to the {100} plane. The absorption coefficient for light having a wavelength of 350 nm was 23 cm$^{-1}$. The number of chips in the precision bit after the cutting evaluation was counted in the same manner as in the example. The number of chips was greater than the number of chips counted in the precision bits manufactured using high-temperature and high-pressure synthesized Ib-type diamond single crystals.

Comparative Example 1-2 to Comparative Example 1-4

Diamond single crystal seed substrates according to Comparative Examples 1-2 to 1-4 listed in Table II were prepared. Each of these diamond single crystal seed substrates had a size of 4×4×0.5 mm in thickness and was a high-temperature and high-pressure synthesized Ib-type diamond single crystal (HPHT Ib). A 4×4 mm main surface ({100} plane) had a surface roughness Ra of 40 nm or less. Table II shows the off-angle of a main surface of each of the seed substrates on which a diamond single crystal is to be grown in a downstream process, and the transmittance of light having a wavelength of 800 nm.

The transmittance of light having a wavelength of 800 nm through each of the seed substrates was then decreased as shown in Table II by ion implantation through the main surface. The ion implantation conditions were selected from the conditions described in the examples. A diamond single crystal was epitaxially grown on the ion-implanted main surface. A microwave plasma CVD apparatus was used for the growth. Raw material gases hydrogen, methane, and nitrogen were introduced into the apparatus. The amounts of the gases were adjusted so as to satisfy $N_C/N_H$, $N_N/N_C$, and T listed in Table II in the synthesis. More specifically, $N_C/N_H$ was 10% or more and 40% or less, $N_N/N_C$ was 0.1% or more and 10% or less, and T was outside the range of 850° C. or more and less than 1000° C.

After the growth, the diamond single crystal was separated from each of the seed substrates by laser cutting. The main surface on the growth surface side and the main surface on the laser cut surface side of the diamond single crystal were polished such that the distance (thickness) between the main surfaces was 1 mm, the parallelism of the main surfaces was 10 μm or less, and the surface roughness Ra was 40 nm or less.

The absorption coefficient of the diamond single crystal produced on each of the seed substrates for light having a wavelength of 350 nm was measured with an ultraviolet-visible spectrophotometer. Table II shows the results. Since $N_C/N_H$ was 10% or more and 40% or less, $N_N/N_C$ was 0.1% or more and 10% or less, and T was outside the range of 850° C. or more and less than 1000° C. in the synthesis conditions, the absorption coefficient was not in the range of 25 to 80 cm$^{-1}$.

The number of chips in the precision bits after the cutting evaluation was counted in the same manner as in the example. The number of chips was greater than the number of chips counted in the precision bits manufactured using high-temperature and high-pressure synthesized Ib-type diamond single crystals.

Comparative Example 1-5

As shown in Table II, a diamond single crystal was produced in the same manner as in No. 1-13 except that the transmittance of light having a wavelength of 800 nm was not decreased by ion implantation in the seed substrate. The absorption coefficient for light having a wavelength of 350 nm was 24 cm$^{-1}$.

The number of chips in the precision bit after the cutting evaluation was counted in the same manner as in the example. The number of chips was greater than the number of chips counted in the precision bits manufactured using high-temperature and high-pressure synthesized Ib-type diamond single crystals.

Comparative Example 1-6 to Comparative Example 1-8

Diamond single crystal seed substrates according to Comparative Examples 1-6 to 1-8 listed in Table II were prepared. Each of these seed substrates had a size of 4×4×0.5 mm in thickness and was a high-temperature and high-pressure synthesized Ib-type diamond single crystal (HPHT Ib). A 4×4 mm main surface ({100} plane) had a surface roughness Ra of 40 nm or less. Table II shows the off-angle of a main surface of each of the seed substrates on which a diamond single crystal is to be grown in a downstream process, and the transmittance of light having a wavelength of 800 nm.

The transmittance of light having a wavelength of 800 nm through each of the seed substrates was then decreased as shown in Table II by ion implantation through the main surface. The ion implantation conditions were selected from the conditions described in the examples. A diamond single crystal was epitaxially grown on the ion-implanted main surface. A microwave plasma CVD apparatus was used for the growth. Raw material gases hydrogen, methane, and nitrogen were introduced into the apparatus. The amounts of the gases were adjusted so as to satisfy $N_C/N_H$, $N_N/N_C$, and T listed in Table II in the synthesis. More specifically, $N_C/N_H$ was 10% or more and 40% or less, $N_N/N_C$ was 0.1% or more and 10% or less, and T was outside the range of 850° C. or more and less than 1000° C.

After the growth, the diamond single crystal was separated from each of the seed substrates by laser cutting. The main surface on the growth surface side and the main surface on the laser cut surface side of the diamond single crystal were polished such that the distance (thickness) between the main surfaces was 1 mm, the parallelism of the main surfaces was 10 μm or less, and the surface roughness Ra was 40 nm or less.

As shown in Table II, a diamond single crystal produced on each of the seed substrates contains graphite black spots. Since $N_C/N_H$ was 10% or more and 40% or less, $N_N/N_C$ was 0.1% or more and 10% or less, and T was outside the range of 850° C. or more and less than 1000° C. in the synthesis conditions, the graphite black spots occurred.

Comparative Example 1-9

With respect to the ion implantation conditions, phosphorus was used as an ionic species, the implantation energy was 150 keV, and the implantation dose was $1\times10^{17}$ cm$^{-2}$. As shown in Table II, in an attempt to produce a diamond single crystal in the same manner as in No. 1-01 except the ion implantation conditions, a polycrystalline diamond grew.

Comparative Example 1-10

With respect to the ion implantation conditions, carbon was used as an ionic species, the implantation energy was 350 keV, and the implantation dose was $1\times10^{17}$ cm$^{-2}$. As shown in Table II, a diamond single crystal was produced in the same manner as in No. 1-13 except the ion implantation conditions. The absorption coefficient for light having a wavelength of 350 nm was 24 cm$^{-1}$.

The number of chips in the precision bit after the cutting evaluation was counted in the same manner as in the example. The number of chips was greater than the number of chips counted in the precision bits manufactured using high-temperature and high-pressure synthesized Ib-type diamond single crystals.

TABLE II

| | Diamond single crystal seed substrate | | | Seed substrate after implantation | CVD diamond growth | | | CVD diamond single crystal | |
|---|---|---|---|---|---|---|---|---|---|
| | | | 800 nm | 800 nm | | | | 350 nm absorption | |
| Number | Type | Off-angle [°] | transmittance [%] | transmittance [%] | $N_C/N_H$ [%] | $N_N/N_C$ [%] | T [° C.] | coefficient [cm$^{-1}$] | Graphite black spots |
| Comparative example 1-1 | HPHT Ib | 7.1 | 70 | 69 | 10 | 0.1 | 995 | 23 | None |
| Comparative example 1-2 | HPHT Ib | 0.0 | 70 | 1 | 10 | 0.1 | 1000 | 23 | None |
| Comparative example 1-3 | HPHT Ib | 0.0 | 70 | 1 | 9 | 0.1 | 995 | 22 | None |
| Comparative example 1-4 | HPHT Ib | 0.0 | 70 | 1 | 10 | 0.09 | 995 | 24 | None |
| Comparative example 1-5 | HPHT Ib | 0.0 | 70 | 70 | 40 | 10 | 850 | 24 | None |
| Comparative example 1-6 | HPHT Ib | 7.0 | 70 | 69 | 40 | 10 | 845 | 44 | Observed |
| Comparative example 1-7 | HPHT Ib | 7.0 | 70 | 69 | 41 | 10 | 850 | 45 | Observed |
| Comparative example 1-8 | HPHT Ib | 7.0 | 70 | 69 | 40 | 11 | 850 | 43 | Observed |
| Comparative example 1-9 | HPHT Ib | 7.0 | 70 | 0 | 10 | 0.1 | 995 | No single crystal growth | |
| Comparative example 1-10 | HPHT Ib | 7.0 | 70 | 1 | 40 | 10 | 850 | 22 | None |

Example 2-1

First, diamond single crystal seed substrates Nos. 2-01 to 2-22 listed in Table III were prepared. Each of these diamond single crystal seed substrates had a size of 4×4×0.5 mm in thickness. Nos. 2-01 to 2-13 were high-temperature and high-pressure synthesized Ib-type diamond single crystals (HPHT Ib). Nos. 2-14 to 2-17 were high-temperature and high-pressure synthesized IIa-type diamond single crystals (HPHT IIa). Nos. 2-18 to 2-22 were gas-phase-synthesized diamond single crystals (CVD).

A 4×4 mm main surface ({100} plane) had a surface roughness Ra of 40 nm or less. Table III shows the off-angle of a main surface of each of the seed substrates on which a diamond single crystal is to be grown in a downstream process, and the transmittance of light having a wavelength of 800 nm.

The transmittance of light having a wavelength of 800 nm through each of the seed substrates was then decreased as shown in Table III by ion implantation through the main surface. With respect to the ion implantation conditions, phosphorus was used as an ionic species, the implantation energy ranged from 100 to 800 keV, and the implantation dose ranged from $1 \times 10^{13}$ to $5 \times 10^{15}$ cm$^{-2}$. A diamond single crystal was epitaxially grown on the ion-implanted main surface.

A microwave plasma CVD apparatus was used for the growth. Raw material gases hydrogen, methane, and nitrogen were introduced into the apparatus. A first layer and a second layer were synthesized while the amounts of the gases were adjusted so as to satisfy $N_C/N_H$, $N_N/N_C$, and T listed in Table III. With respect to the synthesis conditions for the first layer, $N_C/N_H$ was 10% or more and 40% or less, $N_N/N_C$ was 0.1% or more and 10% or less, T was 850° C. or more and less than 1000° C., and the pressure P was 65 Torr or more and less than 110 Torr. With respect to the synthesis conditions for the second layer, $N_C/N_H$ was more than 0% and less than 10% or $N_N/N_C$ was less than 0.1%, T was less than 1000° C., and the pressure P was 110 Torr or more and 400 Torr or less.

After the growth, the diamond single crystal was separated from each of the seed substrates by laser cutting. The main surface on the growth surface side and the main surface on the laser cut surface side of the diamond single crystal were polished such that the distance (thickness) between the main surfaces was 1 mm, the thickness of the first layer was 900 μm, the thickness of the second layer was 100 μm, the parallelism of the main surfaces was 10 μm or less, and the surface roughness Ra was 40 nm or less.

A portion of a diamond single crystal produced on each of the seed substrates was cut out. The absorption coefficients of the first layer and the second layer for light having a wavelength of 350 nm were measured with an ultraviolet-visible spectrophotometer and utilizing reactive ion etching. Table III shows the results.

Observation of each of the diamond single crystals with a stereoscopic microscope showed that no black spot due to graphite was observed in any of the diamond single crystals.

A cutting tool was manufactured using each of the diamond single crystals including the first layer having an absorption coefficient in the range of 25 to 80 cm$^{-1}$ and the second layer having an absorption coefficient of less than 25 cm$^{-1}$ such that the second layer formed a rake face, and was subjected to cutting performance evaluation.

A cylindrical aluminum alloy AC4B was selected as a workpiece. The periphery of the workpiece was turned 50 km at a cutting speed of 600 m/min under the same conditions. After that, the cutting edge of the cutting tool was microscopically observed. The number of chips having a length of 0.5 μm or more was counted in the cutting tool in the observation. The number of chips was smaller than the number of chips counted in cutting tools manufactured using high-temperature and high-pressure synthesized Ib-type diamond single crystals evaluated in the same manner. The flank wear was also smaller than the flank wears of cutting tools manufactured using high-temperature and high-pressure synthesized Ib-type diamond single crystals evaluated in the same manner.

TABLE III-1

| | Diamond single crystal seed substrate | | Seed substrate after implantation | CVD diamond growth | | | | CVD diamond single crystal | Presence or |
|---|---|---|---|---|---|---|---|---|---|
| | | | 800 nm | | | | | 350 nm absorption | absence of |
| Number | Type | Off-angle [°] | 800 nm transmittance [%] | transmittance [%] | Layer No. n | $N_C/N_H$ [%] | $N_N/N_C$ [%] | T [° C.] | coefficient [cm$^{-1}$] | graphite black spots |
| No. 2-01 | HPHT Ib | 7.0 | 70 | 69 | 1 | 10 | 0.1 | 995 | 25 | None |
| | | | | | 2 | 10 | 0.09 | 850 | 23 | None |
| No. 2-02 | HPHT Ib | 7.0 | 70 | 1 | 1 | 40 | 10 | 850 | 50 | None |
| | | | | | 2 | 40 | 0.09 | 850 | 24 | None |
| No. 2-03 | HPHT Ib | 5.0 | 70 | 54 | 1 | 15 | 0.1 | 990 | 41 | None |
| | | | | | 2 | 9 | 0.1 | 850 | 22 | None |
| No. 2-04 | HPHT Ib | 3.0 | 70 | 29 | 1 | 20 | 1 | 950 | 52 | None |
| | | | | | 2 | 9 | 10 | 850 | 24 | None |
| No. 2-05 | HPHT Ib | 2.0 | 70 | 14 | 1 | 27 | 3 | 910 | 59 | None |
| | | | | | 2 | 27 | 0.09 | 910 | 22 | None |
| No. 2-06 | HPHT Ib | 1.0 | 70 | 5 | 1 | 32 | 7 | 870 | 66 | None |
| | | | | | 2 | 5 | 7 | 870 | 10 | None |
| No. 2-07 | HPHT Ib | 0.6 | 70 | 69 | 1 | 10 | 0.1 | 995 | 28 | None |
| | | | | | 2 | 10 | 0.09 | 995 | 18 | None |

TABLE III-2

| | | Diamond single crystal seed substrate | | Seed substrate after implantation | CVD diamond growth | | | | CVD diamond single crystal | |
|---|---|---|---|---|---|---|---|---|---|---|
| Number | Type | Off-angle [°] | 800 nm transmittance [%] | 800 nm transmittance [%] | Layer No. n | $N_C/N_H$ [%] | $N_N/N_C$ [%] | T [° C.] | 350 nm absorption coefficient [cm$^{-1}$] | Presence or absence of graphite black spots |
| No. 2-08 | HPHT Ib | 0.5 | 70 | 69 | 1 | 10 | 0.1 | 995 | 30 | None |
| | | | | | 2 | 3 | 0.1 | 995 | 4 | None |
| No. 2-09 | HPHT Ib | 0.5 | 70 | 1 | 1 | 40 | 10 | 850 | 73 | None |
| | | | | | 2 | 35 | 0.09 | 850 | 23 | None |
| No. 2-10 | HPHT Ib | 0.3 | 70 | 50 | 1 | 20 | 3 | 930 | 47 | None |
| | | | | | 2 | 9 | 3 | 930 | 22 | None |
| No. 2-11 | HPHT Ib | 0.1 | 70 | 20 | 1 | 30 | 7 | 890 | 64 | None |
| | | | | | 2 | 30 | 0.09 | 890 | 22 | None |
| No. 2-12 | HPHT Ib | 0.0 | 70 | 69 | 1 | 10 | 0.1 | 995 | 35 | None |
| | | | | | 2 | 10 | 0.09 | 995 | 19 | None |
| No. 2-13 | HPHT Ib | 0.0 | 70 | 1 | 1 | 40 | 10 | 850 | 80 | None |
| | | | | | 2 | 9 | 10 | 850 | 24 | None |
| No. 2-14 | HPHT IIa | 7.0 | 70 | 69 | 1 | 10 | 0.1 | 995 | 25 | None |
| | | | | | 2 | 10 | 0.09 | 850 | 23 | None |

TABLE III-3

| | | Diamond single crystal seed substrate | | Seed substrate after implantation | CVD diamond growth | | | | CVD diamond single crystal | |
|---|---|---|---|---|---|---|---|---|---|---|
| Number | Type | Off-angle [°] | 800 nm transmittance [%] | 800 nm transmittance [%] | Layer No. n | $N_C/N_H$ [%] | $N_N/N_C$ [%] | T [° C.] | 350 nm absorption coefficient [cm$^{-1}$] | Presence or absence of graphite black spots |
| No. 2-15 | HPHT IIa | 0.6 | 70 | 69 | 1 | 10 | 0.1 | 995 | 28 | None |
| | | | | | 2 | 10 | 0.09 | 995 | 18 | None |
| No. 2-16 | HPHT IIa | 0.5 | 70 | 69 | 1 | 10 | 0.1 | 995 | 30 | None |
| | | | | | 2 | 1 | 0.1 | 995 | 1 | None |
| No. 2-17 | HPHT IIa | 0.0 | 70 | 69 | 1 | 10 | 0.1 | 995 | 35 | None |
| | | | | | 2 | 10 | 0.09 | 995 | 19 | None |
| No. 2-18 | CVD | 7.0 | 70 | 69 | 1 | 10 | 0.1 | 995 | 26 | None |
| | | | | | 2 | 10 | 0.09 | 850 | 24 | None |
| No. 2-19 | CVD | 0.6 | 50 | 49 | 1 | 10 | 0.1 | 995 | 29 | None |
| | | | | | 2 | 10 | 0.09 | 995 | 19 | None |
| No. 2-20 | CVD | 0.5 | 30 | 29 | 1 | 10 | 0.1 | 995 | 32 | None |
| | | | | | 2 | 9 | 0.1 | 995 | 18 | None |
| No. 2-21 | CVD | 0.0 | 10 | 9 | 1 | 10 | 0.1 | 995 | 37 | None |
| | | | | | 2 | 10 | 0.09 | 995 | 21 | None |
| No. 2-22 | CVD | 0.0 | 2 | 1 | 1 | 10 | 0.1 | 995 | 39 | None |
| | | | | | 2 | 10 | 0.09 | 995 | 23 | None |

Comparative Example 2-1

A diamond single crystal according to Comparative Example 1 listed in Table IV was manufactured. A first layer and a second layer had an absorption coefficient of 22 and 23 cm$^{-1}$, respectively, for light having a wavelength of 350 nm.

In the same manner as in the examples, a cutting tool was manufactured, and a workpiece was cut with the cutting tool. The number of chips after the cutting was counted. The number of chips was greater than the number of chips counted in the precision bits manufactured using high-temperature and high-pressure synthesized Ib-type diamond single crystals.

Comparative Example 2-2

A diamond single crystal according to Comparative Example 2 listed in Table IV was manufactured. A first layer and a second layer had an absorption coefficient of 50 and 27 cm$^{-1}$, respectively, for light having a wavelength of 350 nm.

In the same manner as in the examples, a cutting tool was manufactured, and a workpiece was cut with the cutting tool. The flank wear after the cutting was measured. The flank wear was greater than the flank wear of a bit manufactured using a known diamond single crystal having an absorption coefficient of 5 cm$^{-1}$ for light having a wavelength of 350 nm.

TABLE IV

| | Diamond single crystal seed substrate | | | Seed substrate after implantation | CVD diamond growth | | | | CVD diamond single crystal | Presence or absence of |
|---|---|---|---|---|---|---|---|---|---|---|
| | | | 800 nm | 800 nm | | | | | 350 nm absorption | |
| Number | Type | Off-angle [°] | transmittance [%] | transmittance [%] | Layer No. n | $N_C/N_H$ [%] | $N_N/N_C$ [%] | T [° C.] | coefficient [cm$^{-1}$] | graphite black spots |
| Comparative example 2-1 | HPHT Ib | 7.0 | 70 | 69 | 1 | 5 | 0.1 | 995 | 22 | None |
| | | | | | 2 | 10 | 0.09 | 850 | 23 | None |
| Comparative example 2-2 | HPHT Ib | 7.0 | 70 | 1 | 1 | 40 | 10 | 850 | 50 | None |
| | | | | | 2 | 40 | 0.2 | 850 | 27 | None |

Example 2-2

First, a diamond single crystal seed substrate No. 2-23 listed in Table V was prepared. The diamond single crystal seed substrate had a size of 4×4×0.5 mm in thickness and was a high-temperature and high-pressure synthesized Ib-type diamond single crystal (HPHT Ib). A 4×4 mm main surface had a surface roughness Ra of 40 nm or less. Table V shows the off-angle of a main surface of the seed substrate on which a diamond single crystal is to be grown in a downstream process, and the transmittance of light having a wavelength of 800 nm.

The transmittance of light having a wavelength of 800 nm through the seed substrate was then decreased as shown in Table V by ion implantation through the main surface. With respect to the ion implantation conditions, phosphorus was used as an ionic species, the implantation energy was 600 keV, and the implantation dose was 5×10$^{15}$ cm$^{-2}$. A diamond single crystal was epitaxially grown on the ion-implanted main surface.

A microwave plasma CVD apparatus was used for the growth. Raw material gases hydrogen, methane, and nitrogen were introduced into the apparatus. First to fourth layers were synthesized while the amounts of the gases were adjusted so as to satisfy $N_C/N_H$, $N_N/N_C$, and T listed in Table V. With respect to the synthesis conditions for the first to third layers, $N_C/N_H$ was 10% or more and 40% or less, $N_N/N_C$ was 0.1% or more and 10% or less, T was 850° C. or more and less than 1000° C., and the pressure P was 65 Torr or more and less than 110 Torr. With respect to the synthesis conditions for the fourth layer, $N_C/N_H$ was more than 0% and less than 10% or $N_N/N_C$ was less than 0.1%, T was less than 1000° C., and the pressure P was 110 Torr or more and 400 Torr or less.

After the growth, the diamond single crystal was separated from the seed substrate by laser cutting. The main surface on the growth surface side and the main surface on the laser cut surface side of the diamond single crystal were polished such that the distance (thickness) between the main surfaces was 1 mm, the thickness of the first layer was 700 μm, the thicknesses of the second and third layers were 100 the parallelism of the main surfaces was 10 μm or less, and the surface roughness Ra was 40 nm or less.

A portion of a diamond single crystal produced on the seed substrate was cut out. The absorption coefficients of the first to fourth layers for light having a wavelength of 350 nm were measured with an ultraviolet-visible spectrophotometer and utilizing reactive ion etching. Table V shows the results.

In the diamond single crystal thus produced, the first to third layers had an absorption coefficient in the range of 25 to 80 cm$^{-1}$, the fourth layer had an absorption coefficient of less than 25 cm$^{-1}$, and the absorption coefficient for light having a wavelength of 350 nm increased monotonically from one main surface to the other main surface. A cutting tool was manufactured using the diamond single crystal such that the fourth layer formed a rake face, and was subjected to cutting performance evaluation.

A cylindrical aluminum alloy AC4B was selected as a workpiece. The periphery of the workpiece was turned 50 km at a cutting speed of 600 m/min under the same conditions as Example 1. After that, the cutting edge of the cutting tool was microscopically observed. The number of chips having a length of 0.5 μm or more was counted in the observation. The number of chips was smaller than the number of chips counted in a cutting tool manufactured using the No. 2-13 diamond single crystal evaluated in the same manner.

TABLE V

| | Diamond single crystal seed substrate | | | Seed substrate after implantation | CVD diamond growth | | | | CVD diamond single crystal | Presence or absence of |
|---|---|---|---|---|---|---|---|---|---|---|
| | | | 800 nm | 800 nm | | | | | 350 nm absorption | |
| Number | Type | Off-angle [°] | transmittance [%] | transmittance [%] | Layer No. n | $N_C/N_H$ [%] | $N_N/N_C$ [%] | T [° C.] | coefficient [cm$^{-1}$] | graphite black spots |
| No. 2-23 | HPHT Ib | 0.0 | 70 | 1 | 1 | 40 | 10 | 850 | 80 | None |
| | | | | | 2 | 20 | 10 | 850 | 55 | None |
| | | | | | 3 | 13 | 10 | 850 | 34 | None |
| | | | | | 4 | 9 | 10 | 850 | 24 | None |

Example 3-1

Figure 3:
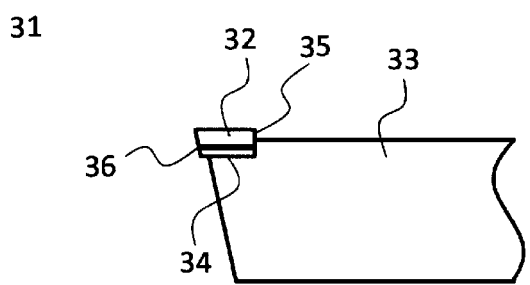
FIG. 3 is a schematic view of the structure of a single crystal diamond cutting tool manufactured in an example.

Single crystal diamond cutting tools (Nos. 3-01 to 3-42) having the shape illustrated in FIG. 3 were manufactured as single crystal diamond tools and were subjected to a cutting evaluation test. A diamond single crystal joined to a shank of each of the cutting tools was manufactured as described below.

<Production of Diamond Single Crystal>

First, 4×4×0.5 mm in thickness diamond single crystal seed substrates of a high-temperature and high-pressure synthesized Ib-type diamond single crystal (HPHT Ib), high-temperature and high-pressure synthesized IIa-type diamond single crystal (HPHT IIa), or gas-phase-synthesized diamond single crystal substrate (CVD) were prepared.

A 4×4 mm main surface ({100} plane) had a surface roughness Ra of 40 nm or less. Table VI shows the off-angle of a main surface of each of the seed substrates on which a diamond single crystal is to be grown in a downstream process, and the transmittance of light having a wavelength of 800 nm.

The transmittance of light having a wavelength of 800 nm through each of the seed substrates was then decreased as shown in Table VI by ion implantation through the main surface. With respect to the ion implantation conditions, phosphorus was used as an ionic species, the implantation energy ranged from 100 to 800 keV, and the implantation dose ranged from $1\times10^{13}$ to $5\times10^{15}$ $cm^{-2}$.

A diamond single crystal was epitaxially grown on the ion-implanted main surface. A microwave plasma CVD apparatus was used for the growth. Raw material gases hydrogen, methane, and nitrogen were introduced into the apparatus. The amounts of the gases were adjusted so as to satisfy $N_C/N_H$, $N_N/N_C$, and T listed in Table VI in the synthesis.

After the crystal growth, the diamond single crystal was separated from each of the seed substrates by laser cutting. The main surface on the growth surface side and the main surface on the laser cut surface side of the diamond single crystal were polished such that the distance (thickness) between the main surfaces was 1 mm, the parallelism of the main surfaces was 10 μm or less, and the surface roughness Ra was 40 nm or less.

The absorption coefficient of the diamond single crystal produced on each of the seed substrates for light having a wavelength of 350 nm was measured with an ultraviolet-visible spectrophotometer. Table VI shows the results.

Observation of the diamond single crystals with a stereoscopic microscope showed that no black spot due to graphite was observed in any of the diamond single crystals.

to a shank of a cutting tool as a diamond single crystal insert. The insert was joined to the shank by silver brazing.

The plane orientation of the bottom and back side of the diamond single crystal insert to be joined to the shank was the {100} plane.

As shown in Table VII, a change (A) in transmittance of light having a wavelength of 800 nm due to the removal of the ion-implanted layer of the diamond single crystal insert ranged from 1% to 70%, and the absorption coefficient (B) for light having a wavelength of 350 nm ranged from 1 to 80 $cm^{-1}$.

An ion-implanted layer was formed by implantation through a main surface on the side to be joined to the shank. The implanted ionic species was phosphorus, the implantation energy was 900 keV, the implantation angle was 7 degrees, and the implantation dose ranged from $1\times10^{13}$ to $5\times10^{15}$ $cm^{-2}$. The implantation depth was 0.53 μm from the main surface on the side to be joined to the shank.

The insert nose had a curvature radius of 1 mm, a rake angle of 0 degrees, a clearance angle of 7 degrees, and a degree of contour in the range of 50 to 100 nm.

The cutting tool was subjected to a cutting test. A cylindrical aluminum alloy AC4B was selected as a workpiece. The periphery of the workpiece was turned 50 km at a cutting speed of 600 m/min, a feed speed of 0.1 mm/rotation, and a cutting allowance of 0.2 mm/diameter. An aqueous emulsion was used as a cutting fluid. After that, the cutting edge of the cutting tool was microscopically observed. The number of chips or cracks having a length of 0.5 μm or more was counted in the cutting tool in the observation.

As a result, the number of chips or cracks was 7 in a cutting tool manufactured using a high-temperature and high-pressure synthesized Ib-type diamond single crystal evaluated in the same manner, 5 to 7 in Nos. 3-01 to 3-09, 2 to 4 in Nos. 3-10 to 3-21, 1 to 2 in Nos. 3-22 to 3-30, and 0 to 1 in Nos. 3-31 to 3-42. The flank wear in all the Nos. 3-01 to 3-42 was smaller than the flank wears of cutting tools manufactured using high-temperature and high-pressure synthesized Ib-type diamond single crystals evaluated in the same manner.

The tool performance of the Nos. 3-01 to 3-09 cutting tools with respect to the number of chips or cracks and the flank wear was equal to or higher than the tool performance

TABLE VI

| | Diamond single crystal seed substrate | | | Seed substrate after implantation | CVD diamond growth | | | CVD diamond single crystal | |
|---|---|---|---|---|---|---|---|---|---|
| Number | Type | Off-angle [°] | 800 nm transmittance [%] | 800 nm transmittance [%] | $N_C/N_H$ [%] | $N_N/N_C$ [%] | T [° C.] | 350 nm absorption coefficient [$cm^{-1}$] | Graphite black spots |
| No. a | HPHT Ib | 7.0 | 70 | 69 | 8 | 0.01 | 995 | 1 | None |
| No. b | HPHT Ib | 7.0 | 70 | 1 | 9 | 10 | 850 | 10 | None |
| No. c | HPHT IIa | 5.0 | 70 | 54 | 9 | 0.1 | 990 | 24 | None |
| No. d | HPHT IIa | 3.0 | 70 | 29 | 10 | 0.2 | 950 | 25 | None |
| No. e | CVD | 2.0 | 70 | 14 | 27 | 3 | 910 | 50 | None |
| No. f | CVD | 1.0 | 70 | 5 | 32 | 7 | 870 | 80 | None |

<Manufacture of Single Crystal Diamond Cutting Tool>

Seven samples of each of the diamond single crystals Nos. a to f thus produced were subjected to ion implantation. After the ion implantation, a single crystal diamond cutting tool was manufactured by joining the diamond single crystal of known cutting tools manufactured using high-temperature and high-pressure synthesized Ib-type diamond single crystals. The tool performance of the Nos. 3-10 to 3-42 cutting tools was better than the tool performance of the known cutting tools.

TABLE VII

| A | B | | | | | |
|---|---|---|---|---|---|---|
| | 1 | 10 | 24 | 25 | 50 | 80 |
| 1 | No. 3-01 | No. 3-02 | No. 3-03 | No. 3-22 | No. 3-23 | No. 3-24 |
| 5 | No. 3-04 | No. 3-05 | No. 3-06 | No. 3-25 | No. 3-26 | No. 3-27 |
| 9 | No. 3-07 | No. 3-08 | No. 3-09 | No. 3-28 | No. 3-29 | No. 3-30 |
| 10 | No. 3-10 | No. 3-11 | No. 3-12 | No. 3-31 | No. 3-32 | No. 3-33 |
| 30 | No. 3-13 | No. 3-14 | No. 3-15 | No. 3-34 | No. 3-35 | No. 3-36 |
| 50 | No. 3-16 | No. 3-17 | No. 3-18 | No. 3-37 | No. 3-38 | No. 3-39 |
| 70 | No. 3-19 | No. 3-20 | No. 3-21 | No. 3-40 | No. 3-41 | No. 3-42 |

A: 800 nm transmittance change due to removal of ion-implanted layer [%]
B: 350 nm absorption coefficient [cm$^{-1}$]

Comparative Example 3-1

Single crystal diamond cutting tools were manufactured in the same manner as in the examples except that all the diamond single crystals produced in the same manner as in the examples included no ion-implanted layer.

The cutting tools were subjected to the cutting test described in the examples. The number of chips or cracks having a length of 0.5 μm or more was more than 7, which was greater than the number of chips or cracks in cutting tools manufactured using high-temperature and high-pressure synthesized Ib-type diamond single crystals.

Comparative Example 3-2

Cutting tools were manufactured using diamond single crystals having absorption coefficients of 81 and 85 cm$^{-1}$ for light having a wavelength of 350 nm without ion implantation.

The cutting tools were subjected to the cutting test described in the examples. However, the cutting tools were cracked during cutting and were not turned 50 km.

All the single crystal diamonds according to the present invention had small mobility (less than 1000 cm$^2$/V/s) and low resistance (less than 10$^{14}$ Ωcm) at a high electric field (10$^5$ V/cm or more) because of impurities and point defects.

The invention claimed is:

1. A diamond single crystal synthesized using a chemical vapor synthesis method and after annealing having an absorption coefficient of 25 cm$^{-1}$ or more and 80 cm$^{-1}$ or less for light having a wavelength of 350 nm.

2. A single crystal diamond tool, comprising a cutting edge made of a diamond single crystal synthesized using a chemical vapor synthesis method and after annealing having an absorption coefficient of 25 cm$^{-1}$ or more and 80 cm$^{-1}$ or less for light having a wavelength of 350 nm.

* * * * *